United States Patent [19]

Shah et al.

[11] Patent Number: 5,132,607
[45] Date of Patent: Jul. 21, 1992

[54] ELECTRICAL FIELD STRENGTH SENSING PROBE

[76] Inventors: Shirsh J. Shah, 114 Olinda Dr., Brea, Calif. 92621; Jozef B. Baran, 25919 Redbay Ln., Moreno Valley, Calif. 92388

[21] Appl. No.: 524,142

[22] Filed: May 15, 1990

[51] Int. Cl.$^5$ .............................. G01R 31/02
[52] U.S. Cl. ........................ 324/72.5; 324/149
[58] Field of Search ............ 324/72, 725, 158 P, 324/96, 149, 95; 340/600; 455/67, 115; 343/730

[56] References Cited

U.S. PATENT DOCUMENTS

| | | | |
|---|---|---|---|
| 2,993,167 | 7/1961 | Smith | 324/72.5 |
| 3,229,212 | 1/1966 | Rogers | 324/72.5 |
| 3,283,242 | 11/1966 | Oliver | 324/72.5 |
| 3,823,373 | 7/1974 | Pike | 324/72.5 |
| 4,005,357 | 1/1977 | Parkinson | 324/72 |
| 4,277,744 | 7/1981 | Audone et al. | 324/72.5 |
| 4,831,327 | 5/1989 | Chevnier et al. | 324/86 |

FOREIGN PATENT DOCUMENTS

| | | | |
|---|---|---|---|
| 56268 | 4/1985 | Japan | 724/511 |
| 1290206 | 2/1987 | U.S.S.R. | 324/95 |

Primary Examiner—Jack B. Harvey
Assistant Examiner—Maura K. Regan
Attorney, Agent, or Firm—Roger C. Turner

[57] ABSTRACT

A probe comprising at least one unshielded sensor tip and at least one transformer shielded within a conductive housing for sensing the electric field strength of a precise near field when connected to a radio frequency meter. Each enclosed transformer includes an annular ferrous core having a primary wire and a secondary wire wound thereon, with the input end of the primary wire extended slightly outside the distal end of the housing providing each sensor tip, and with the reference end of the primary wire connected to an annular conductor of a coaxial connector. The output end of the secondary wire is connected to an annular conductor of the coaxial connector. The reference end of the secondary wire and the shielded housing are connected to the annular conductor of the coaxial connector to provide a ground reference for the circuit.

12 Claims, 5 Drawing Sheets

ELECTRICAL FIELD STRENGTH SENSING PROBE

BACKGROUND OF THE INVENTION

The invention relates to a sensing probe apparatus used for measuring the electrical field strength of a near field; particularly an extremely small sensitive probe for sensing the precise local near field of a complex electronic circuit device.

Electronic circuit devices require strict controls and limits related to electrical leakage, radio frequency emissions and interference. Such devices include densely arranged electronic components, conductors and circuitry which can produce numerous discreet electrical and magnetic fields which combine to form a total field strength. Near field sensing probes are utilized to analyze such electronic devices to determine the source of any electrical energy leakage so that the device can be modified to eliminate or reduce such leakage.

Presently available field strength sensing probes are limited in effectiveness because of their relatively bulky sensing tips measuring from about 0.5 inches to 1.0 inches. Such sensing probes also typically incorporate loop antennas as described in a publication dated May 17, 1984 in EDN by Scott Roleson entitled "Evaluate EMI Reduction Schemes With Shielded-Loop Antennas", and as illustrated in U.S. Pat. No. 4,277,744 and U.S. Pat. No. 4,588,993. Such probes operate on a principle which picks up the magnetic fields as a measured signal component which is an indirect method of locating the true source of the electrical field leakage. In addition, loop antenna probes are very sensitive as to the direction and orientation of the tip of the probe. Such probes also usually incorporate circuitry having common mode current on the shield return and are therefore affected by the potential of the operator.

It is an object of the present invention to provide an electrical field sensing probe which is extremely sensitive and which has a small compact sensor tip to sense the electrical field strength in precisely small regions of the electronic device.

It is an other object to provide a sensing probe which is not significantly affected by magnetic fields and not affected by the potential of the operator.

SUMMARY OF THE INVENTION

The foregoing objects are accomplished by a compact, sensitive probe of the present invention for sensing the electrical field strength of a precise near field. The probe comprises at least one transformer shielded within the body of a generally cylindrically shaped conductive housing having a reduced diameter distal end and a proximal and enclosed by a coaxial connector having a central conductor and an annular shield conductor for connection to a radio frequency meter. Each enclosed transformer includes an annular ferrous core having a primary wire and a secondary wire wound thereon, with the input end of the primary wire extended slightly outside the distal end of said housing providing a sensor tip, and with the reference end of the primary wire connected to the annular conductor of the coaxial connector. The secondary wire is connected to the coaxial connector. The housing is connected to the annular conductor of the coaxial connector, along with the respective wires of the transformer, to provide a ground reference for the circuit.

A first embodiment comprises a single sensor tip and transformer which is somewhat sensitive to the orientation of the probe but which is extremely small for analyzing micro electronic devices.

A second embodiment comprises two sensing tips and two transformers connected in parallel to balance the response of the probe.

A third embodiment comprises two transformers connected in series to particularly provide sensitivity for the lower frequency range. In this embodiment, the response of the two sensor tips are balanced but added, so that, at low source impedance, the reading is about twice the actual electric field strength of the local region of the electronic device.

The probe of the present invention can be configured with a plurality of transformers interconnected in series and/or parallel to sense a desired electrical field ranging in frequency from a few KHz to several GHz. The "absolute" value sensed by the probe is somewhat dependent upon the source impedance at the local near field of the electronic device, but a significant advantage of the probe is its ability to sense the "relative" electrical field strength, to precisely locate the source of any electrical leakage of an electronic circuit or device.

BRIEF DESCRIPTION OF THE DRAWINGS

While the novel features of the invention are set forth in the appended claims, the invention will be better understood along with other features thereof from the following detailed description taken in conjunction with the drawings in which:

DETAILED DESCRIPTION OF THE INVENTION

Figure 1:
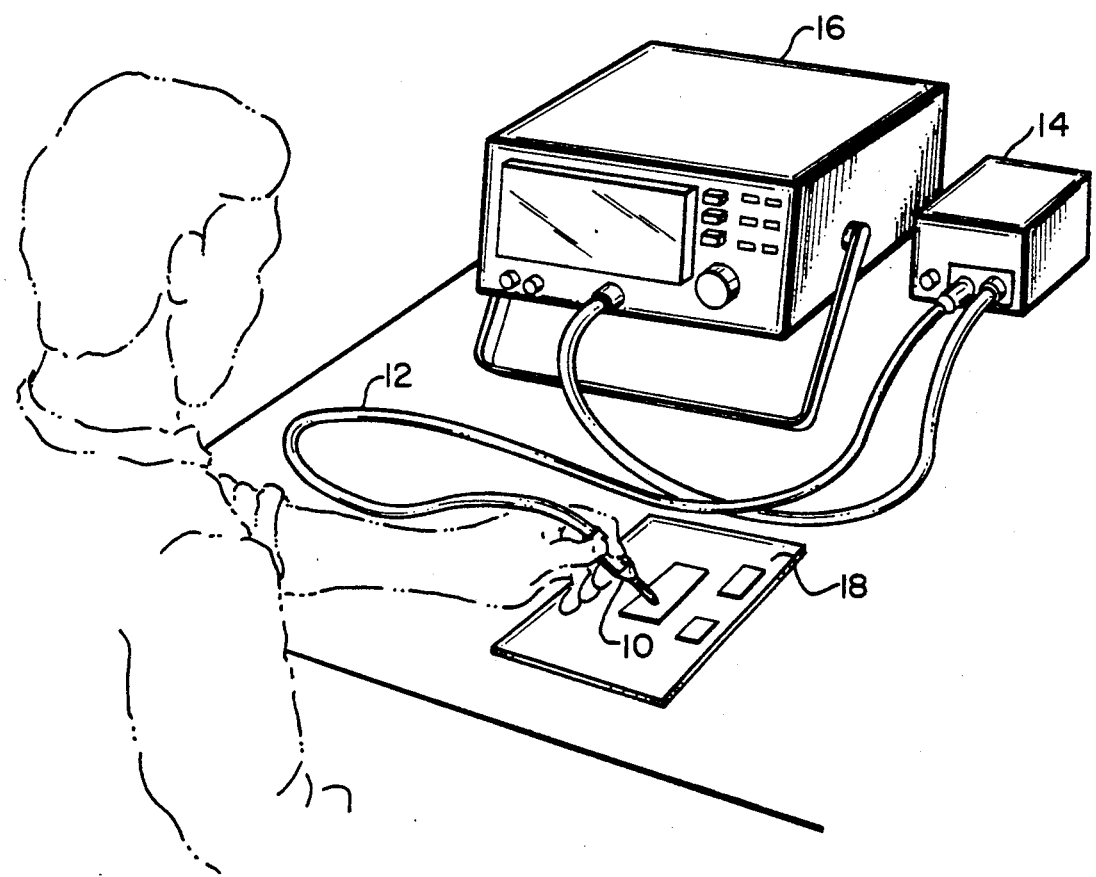
FIG. 1 is a perspective view of the sensing probe of the present invention connected to a preamplifier and an rf spectrum analyzer.

Referring first to FIG. 1, there is illustrated a sensing probe 10 of the present invention connected by a coaxial cable 12 to a preamplifier 14 for increased sensitivity, and further connected to a radio frequency (rf) spectrum analyzer 16. The probe is hand held by an operator and is shown analyzing for electrical leakage "hot spots" on a typical electronic circuit device 18. Examples of spectrum analyzers which are commercially available include models HP8565B and HP8590A from Hewlett Packard, and models ESH3 and ESVP rf receivers from Rhodes and Swartz. An example of a suitable preamplifier is the HP8447F from Hewlett Packard.

Figure 2:
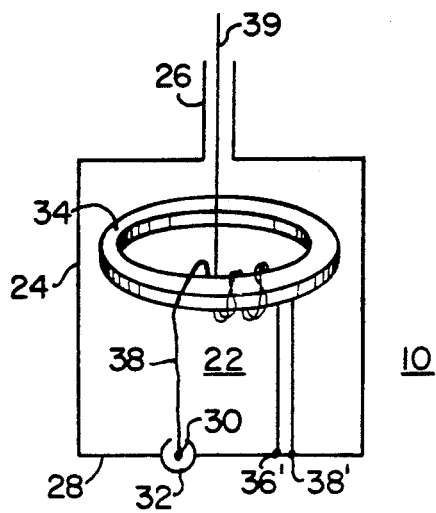
FIG. 2 is a schematic perspective view illustrating a first embodiment of the probe of the present invention.
Figure 3:
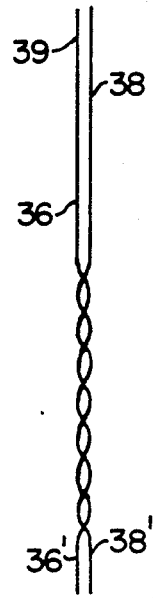
FIG. 3 is a front elevational view of a pair of winding wires for a transformer of the present invention.
Figure 4:
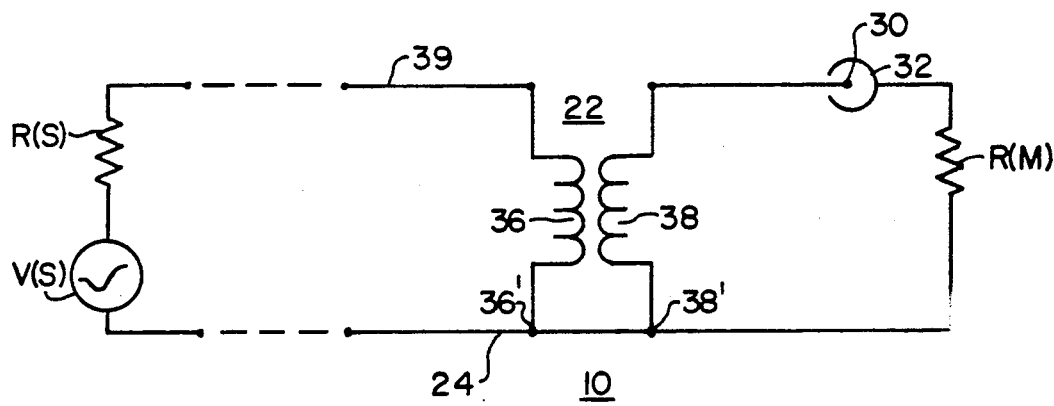
FIG. 4 is a schematic electrical circuit diagram of the embodiment of FIG. 2.

The theory of operation of the invention is shown in FIGS. 2, 3, and 4 illustrating a first embodiment of the probe 10. The present probe utilizes a transformer 22 shielded within the body of a generally cylindrically shaped conductive housing 24 having a reduced diameter distal end 26 and a proximal end 28 enclosed by a coaxial connector having a central conductor 30 and an annular shield conductor 32 for connection to a radio frequency meter (see 12, 14, and 16 of FIG. 1). The conductive housing 24 acts as a "Faraday cage" and, therefore, also acts as an rf ground reference. The transformer 22 includes an annular ferrous core 34 having a primary wire 36 and a secondary wire 38 wound spirally and longitudinally around the periphery of the core. The transformer allows the housing to be used as the reference ground for the sensor tip as well as the signal going to the rf meter. The ferrous core can be any suitable iron, ferrite, powered iron, etc material, for example a ferrite core model T 3012 from Micrometals Inc., which, along with the number of turns of winding wires, determine the range and sensitivity of the transformer. The primary and secondary winding wires 36 and 38 can be any suitable coated conductive wires, for example a pair of enameled copper 30 AWG wires about six inches in length. The wires are preferably twisted as shown in FIG. 3 to provide a bifilar wound core having maximum mutual coupling. A suitable transformer can be provided by four turns of such winding wire around the core 34. The distal tip of the input of the primary wire 36 is extended slightly outside the distal end 26 of the housing providing a sensor tip 39, and the output of the primary wire 36' is connected to the annular conductor 32 of the coaxial connector. The sensor output end of the secondary wire 38 is connected to the central conductor 30 and the reference end of the secondary wire 38' is connected to the annular conductor 32 of the coaxial connector.

As illustrated particularly to FIG. 4, the sensor tip 39 is the only unshielded element of the circuit. When the sensor tip is directed to a local area of an electronic device, any near field radiation, as represented by a source voltage V(s) with a source impedance R(s), will induce a voltage on the circuit which is coupled to the load R(m) of the rf meter to register a reading (dBμV) corresponding to the electrical field strength radiated by the precise location of the electronic device. Probes of the prior art usually incorporate a series of loop antenna wires, which tend to pick up electromagnetic and magnetic fields but do not pick up purely electrical fields of a near field. The present probe does not incorporate any loop antenna and the straight sensor tip 39 primarily senses only the electric field without significant influence by any radiated magnetic fields.

Figure 5:
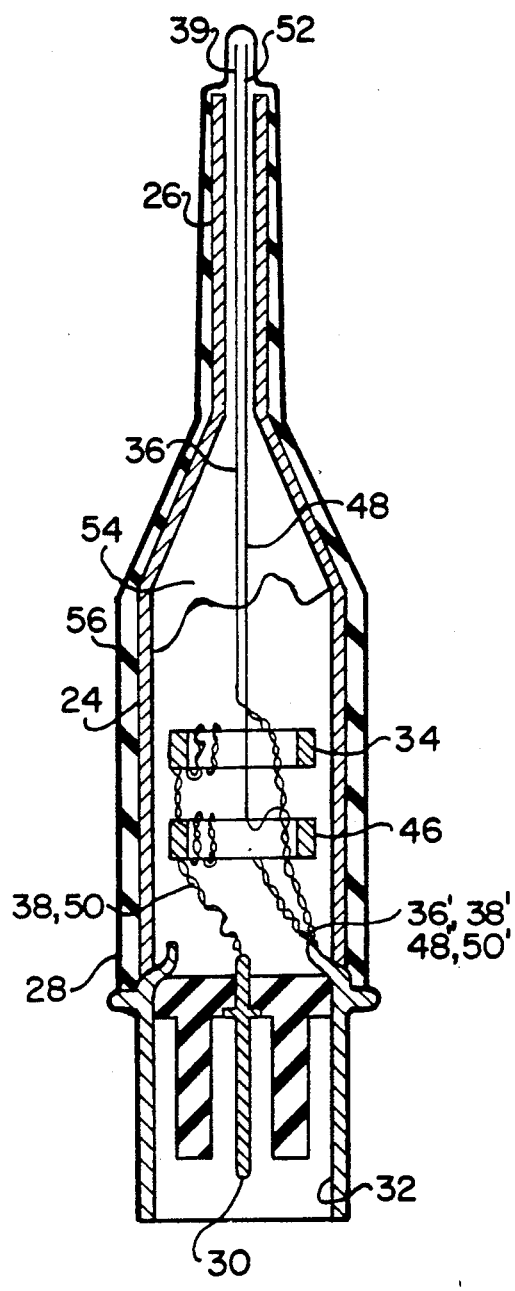
FIG. 5 is an enlarged sectional view of the sensing probe of the present invention, illustrating multiple sensing tips.
Figure 6:
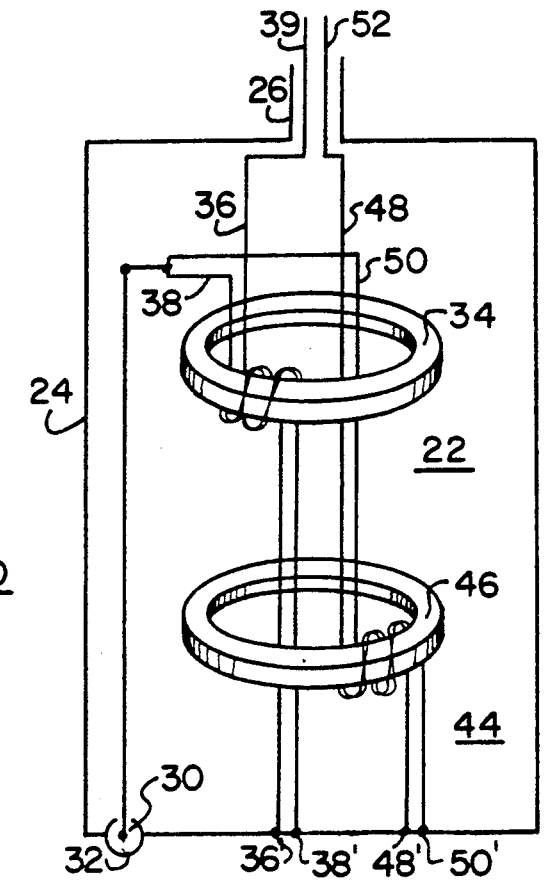
FIG. 6 is a schematic perspective view illustrating a second embodiment of the probe.
Figure 7:
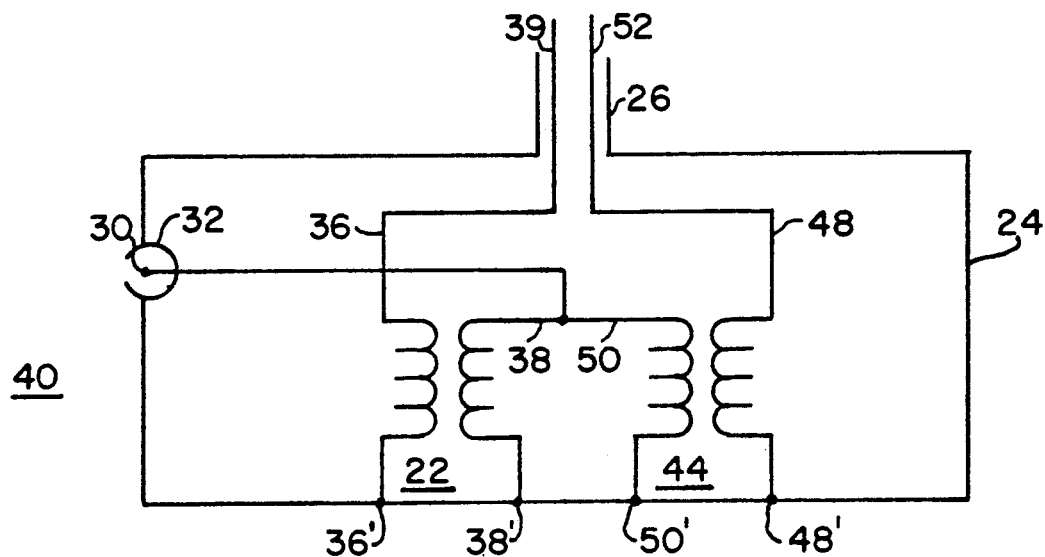
FIG. 7 is a schematic electrical circuit diagram of the embodiment of FIG. 6.

Referring now to FIGS. 5, 6 and 7 the structure of the apparatus is described in more detail in terms of a second embodiment of a sensing probe 40 which utilizes two transformers and sensor tips which are connected in parallel within the conductive housing 24. As previously discussed, the housing is generally cylindrically shaped and formed of a suitable conductive material, such as copper or brass. The body of the housing is about 3.0 inches in length and about 0.50 inches in diameter, and has a thickness of about 0.03 inches. The housing includes an extended distal end 26 about 1.0 inches in length and about 0.05 to 0.10 inches in diameter, and a proximal end 28 which is enclosed by a coaxial connector (for example, BNC, SMA, N type) having a central conductor 30 and an annular shield conductor 32, for connection to an rf meter (as shown in FIG. 1).

Enclosed within the housing 24 is the first transformer 22, as previously discussed, which includes the first annular ferrous core 34 having the primary wire 36 and the secondary wire 38 wound spirally and longitudinally around the periphery of the core. An example of a suitable transformer includes a bifilar wound ferrite core model T 3012 from Micrometals Inc., having enameled winding wires of 30 AWG twisted together and wound about three to six turns around the core. The distal tip of the input end of the primary wire 36 is extended about 0.25 inches outside the distal end 26 of the housing to provide the first sensor tip 39, and the reference end of the primary wire 36' is connected to the annular conductor 32 of the coaxial connector. The output end of the secondary wire 38 is connected to the central conductor 30 and the reference end of the secondary wire 38' is connected to the annular conductor 32 of the coaxial connector. Also enclosed within the housing 24 is a second transformer 44 which includes a second annular ferrous core 46 having a second primary wire 48 and a second secondary wire 50 which are wound and connected respectively in the same manner as that of the first transformer. The input end of the second primary wire is also extended about 0.25 inches outside of the distal end 26 of the housing to provide a second sensor tip 52 adjacent to the first sensor tip 39.

As shown, particularly in FIG. 5, the transformers and circuitry are secured within the shielded housing by a suitable insulative material 54 (such as a potting compound) and the exterior of the probe is further encased within a suitable insulative enclosure 56. The insulative enclosure provides strength and durability to the sensor tips and insures that the probe is not short circuited upon contact with other conductive materials and that the probe does not short circuit the electronic device during operation. The structure of the probe is preferably fabricated by an insert molding process; in which the transformer circuit is pre-assembled to the coaxial connector within the housing, the housing assembly with the extended sensor tips is then inserted within a suitable molding tool and is injection molded with a suitable plastic material to secure the circuitry within the housing and to provide the probe with the durable insulative enclosure 56. The sensing probe 40 of this embodiment has been found to be particularly useful and accurate for sensing upper range frequencies from about 10 MHz to about 1000 MHz.

The sensor tips 39 and 52 are spaced slightly apart and therefore the near field will induce slightly different voltages on each sensor tip, depending upon the location and orientation of the probe relative to the source of elecrical leakage on the electronic device. However, with the transformers so connected, (see particularly FIG. 7) the voltages induced by each sensor are combined to compensate for any such differences to produce a balanced and consistent reading from the probe regardless of its orientation. This feature of the probe can be further enhanced by including additional transformers and sensor tips.

Figure 8:
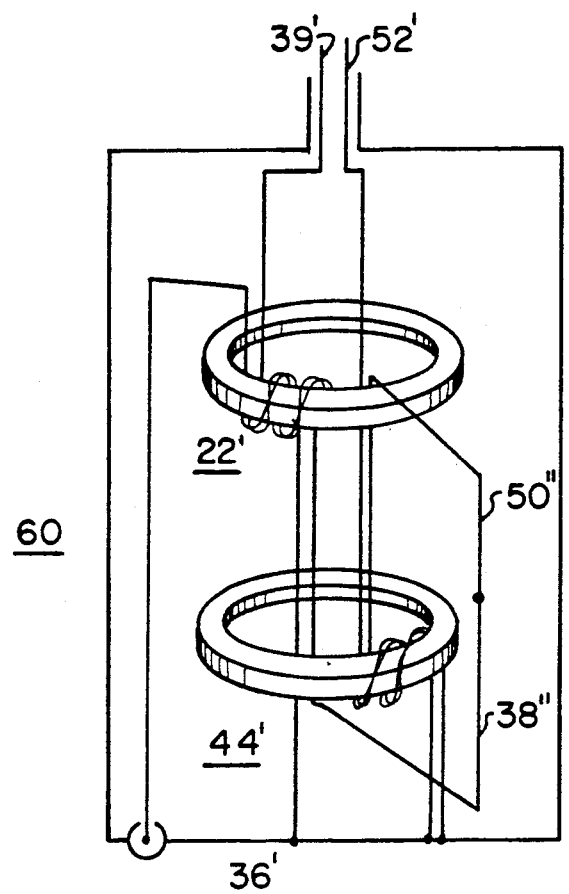
FIG. 8 is a schematic perspective view illustrating another embodiment of the probe.
Figure 9:
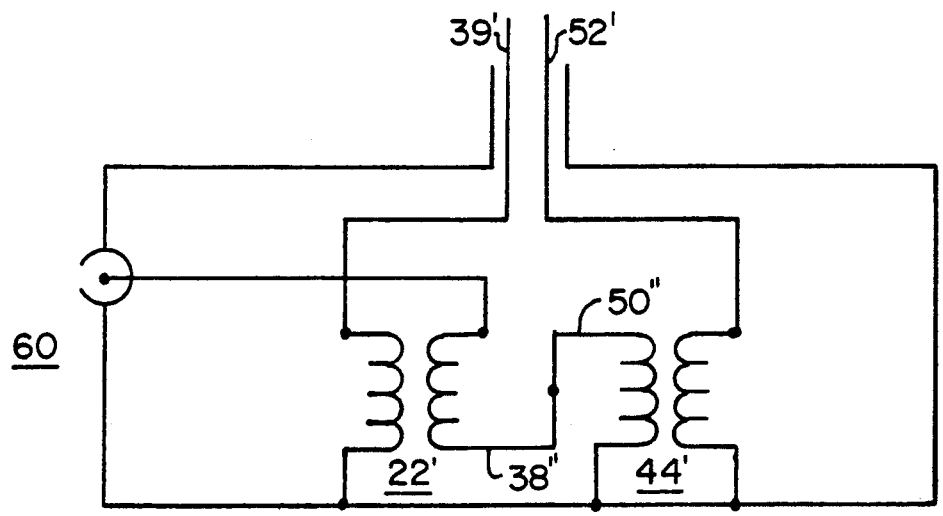
FIG. 9 is a schematic electrical circuit diagram of the embodiment of FIG. 8.

Referring now to FIGS. 8 and 9, there is illustrated another embodiment of a sensing probe 60 which utilizes the two bifilar wound transformers (referenced in this embodiment as 22' and 44') and the sensor tips (referenced in this embodiment as 39' and 52') which are connected in series within the housing 24. This embodiment of the sensing probe 60 is otherwise the same as probe 40 (as discussed in reference to FIGS. 5, 6 and 7) except that the reference end of the first secondary wire 38" is connected to the output end of the second secondary wire 50" to interconnect the transformers in series. A feature of this embodiment is that the rf reading of the induced voltage on each sensor tip 39' and 52' are additive by the transformers 22' and 44' and therefore provide sensitivity which is particularly useful for the lower range frequencies from about 1 Hz to 100 MHz. The actual value of the measured radiation is somewhat dependent upon the source impedance of the local near field; However, for low source impedance, the response of the rf meter represents the sum of the voltages induced on each sensor tip. The combining of the two sensor responses has an averaging influence on the rf reading and tends to eliminate any adverse affects due to the direction and orientation of the probe.

While specific embodiments and examples of the present invention have been illustrated and described herein, it is realized that modifications and changes will occur to those skilled in the art. It is therefore to be understood that the appended claims are intended to cover all such modifications and changes as fall within the true spirit and scope of the invention.

What is claimed is:

1. A small hand holdable probe apparatus for use with a radio frequency meter for sensing the electric field strength of a near field of an electronic device, comprising:
  a generally cylindrically shaped conductive housing having a reduced diameter distal end, a body, and a proximal end enclosed by a coaxial connector having a central conductor and an annular shield conductor for connection to a radio frequency meter;
  a first transformer enclosed within the body of said housing, including a first annular ferrous core having a first primary wire and a first secondary wire wound thereon, with the input end of the primary wire extended slightly outside the distal end of said housing providing a first sensor tip, and with the reference end of the primary wire connected to the annular conductor of said coaxial connector, and with the output end of the secondary wire connected to the central conductor and the reference end of the secondary wire connected to the annular conductor of said coaxial connector;
  said housing also connected to the annular conductor of said coaxial connector; and
  said housing and said sensor tip further enclosed within an insulative material so that said sensor tip can not make direct electrical contact when sensing the near field strength.

2. A probe apparatus as in claim 1 wherein said first transformer has the primary wire twisted together with the secondary wire to provide a bifilar wound core for maximum mutual coupling of the circuit.

3. A probe apparatus as in claim 1 wherein said housing and said sensor tip are further enclosed within an insulative material.

4. A probe apparatus as in claim 1 wherein said first transformer is further enclosed by an insulative material within said housing.

5. A probe apparatus as in claim 1 further comprising a second transformer enclosed within said housing including a second annular ferrous core having a second primary wire and a second secondary wire wound thereon and connected respectively in the same manner as that of said first transformer and having the input end of the second primary wire extended outside of the distal end of said housing providing a second sensor tip.

6. A probe apparatus as in claim 5 wherein said first and said second transformers have the respective primary wire twisted together with the respective secondary wire to provide bifilar wound cores for maximum mutual coupling of the circuit.

7. A probe apparatus as in claim 5 wherein said housing and said sensor tips are further enclosed within an insulative material.

8. A probe apparatus as in claim 5 wherein said first and said second transformers are further enclosed by an insulative material within said housing.

9. A small hand holdable probe apparatus for use with a radio frequency meter for sensing the electric field strength of a near field of an electronic device, comprising:
  a generally cylindrically shaped conductive housing having a reduced diameter distal end, a body, and a proximal end enclosed by a coaxial connector having a central conductor and an annular shield conductor for connection to a radio frequency meter;
  a first transformer enclosed within the body of said housing, including a first annular ferrous core having a first primary wire and a first secondary wire wound thereon, with the input end of the first primary wire extended slightly outside the distal end of said housing providing a first sensor tip, and with the reference end of the first primary wire connected to the annular conductor of said coaxial connector;
  a second transformer enclosed within the body of said housing including a second annular ferrous core having a second primary wire and a second secondary wire wound thereon, with the input end of the second primary wire extended slightly outside of the distal end of said housing providing a second sensor tip, and with the reference end of the second primary wire connected to the annular conductor of said coaxial connector;
  the output end of the first secondary wire of said first transformer connected to the central conductor of said coaxial connector, with the reference end of the first secondary wire connected to the output end of the second secondary wire of said second transformer, with the reference end of the second secondary wire connected to the annular conductor of said coaxial connector, whereby said first and second transformers are connected in series;
  said housing also connected to the annular conductor of said coaxial connector; and
  said housing and said sensor tips further enclosed within an insulative material so that said sensor tips can not make direct electrical contact when sensing the near field strength.

10. A probe apparatus as in claim 9 wherein said first and said transformers have the respective primary wire twisted together with the respective secondary wire to provide bifilar wound cores for maximum mutual coupling of the circuit.

11. A probe apparatus as in claim 9 wherein said housing and said sensor tips are further enclosed within an insulative material.

12. A probe apparatus as in claim 9 wherein said first and said second transformers are further enclosed by an insulative material within said housing.

* * * * *